United States Patent
Brunner et al.

(10) Patent No.: US 6,730,906 B2
(45) Date of Patent: May 4, 2004

(54) METHOD AND APPARATUS FOR TESTING A SUBSTRATE

(75) Inventors: Matthias Brunner, Kirchheim (DE); Ralf Schmid, Poing (DE)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/977,549

(22) Filed: Oct. 15, 2001

(65) Prior Publication Data

US 2002/0024023 A1 Feb. 28, 2002

Related U.S. Application Data

(63) Continuation of application No. 09/204,430, filed on Dec. 3, 1998, now abandoned.

(30) Foreign Application Priority Data

Jan. 26, 1998 (DE) .......................... 198 02 848

(51) Int. Cl.[7] .................. H01J 37/28; H01J 37/244
(52) U.S. Cl. .................. 250/310; 250/307; 250/397
(58) Field of Search ................ 250/310, 307, 250/397

(56) References Cited

U.S. PATENT DOCUMENTS

| | | |
|---|---|---|
| 3,694,652 A | 9/1972 | Banbury et al. |
| 4,264,822 A | 4/1981 | Ueno et al. |
| 4,559,450 A | 12/1985 | Robinson et al. |
| 4,658,137 A * | 4/1987 | Garth et al. ............... 250/310 |
| 4,766,372 A | 8/1988 | Roa |
| 4,788,495 A | 11/1988 | Plies |
| 4,829,243 A | 5/1989 | Woodard, Sr. et al. |
| 4,870,344 A | 9/1989 | Stille |
| 5,231,287 A | 7/1993 | Sekine et al. |
| 5,665,968 A | 9/1997 | Meisburger et al. |
| 5,708,276 A | 1/1998 | Ohkawa et al. |
| 5,990,483 A * | 11/1999 | Shariv et al. ............... 250/397 |
| 6,025,593 A | 2/2000 | Suzuki et al. |
| 6,218,663 B1 * | 4/2001 | Nisch et al. ............... 250/309 |
| 6,497,194 B1 * | 12/2002 | Libby et al. ............ 118/723 FI |

FOREIGN PATENT DOCUMENTS

| | | |
|---|---|---|
| DE | 0370276 B1 | 1/1994 |
| EP | 328869 | 8/1989 |

* cited by examiner

Primary Examiner—Jack Berman
(74) Attorney, Agent, or Firm—Moser, Ritterson, Sheridan, L.L.P.

(57) ABSTRACT

A method and apparatus for testing a substrate, wherein a particle beam is directed onto the substrate and emitted secondary particles are detected with a detector and then evaluated. The location of the site at which the secondary particles are emitted on the substrate relative to the position of the detector is taken into consideration during testing.

28 Claims, 1 Drawing Sheet

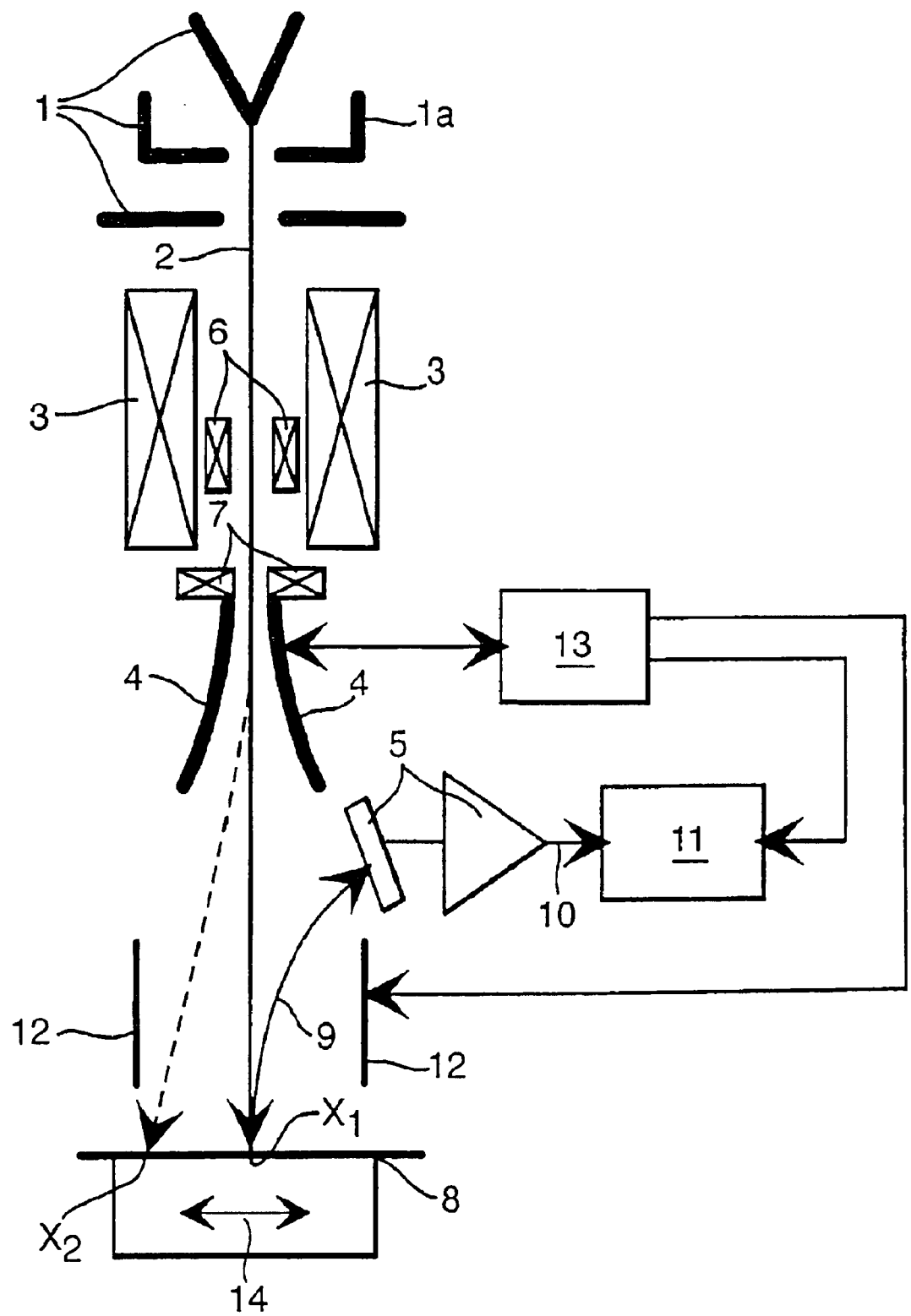

METHOD AND APPARATUS FOR TESTING A SUBSTRATE

This application is a continuation of application Ser. No. 09/204,430, filed Dec. 3, 1998, now abandoned.

The invention relates to a method and to apparatus for testing a substrate in which a particle beam is directed onto the substrate and emitted secondary particles are detected with a detector and then evaluated.

BACKGROUND OF THE INVENTION

The substrates to be tested have for example a plurality of microelectronic or micromechanical elements which often have to be checked in an intermediate stage of production. These elements include for example thin-film transistors or other active elements of a liquid crystal display matrix on a glass plate before assembly with the colour filter, connecting networks of a multichip module substrate before equipping it with ICs, transistors of an integrated circuit on a wafer before sawing and bonding, electron emitters and connections of an emitter array for a FED display before assembly with a counterelectrode and evacuation, and sensors of any kind on their particular supporting substrate.

It is common to these elements that they are produced in a plurality of process steps, consisting of masking, etching, depositing etc. In this case faults can occur due to particles, faulty adjustment, defective process equipment and the like. These faults can lead to disruption of the properties of individual elements on the substrate. It is therefore desirable to be able to test the function of each individual element before further processing and to reject the corresponding substrate or to repair it as well as to identify and eliminate shortcomings in the process.

The testing of these elements makes special requirements of the apparatus and the method because of the small dimensions. The mechanical contacting for measurement of electrical quantities increasingly fails because of the size of the measuring points and requires a very high degree of precision. In addition, mechanical contact cannot be tolerated in many cases because of the associated damage to the contact surface. Similar restrictions also apply to the measurement of other quantities, e.g. mechanical quantities, by mechanically acting test devices. Therefore apparatus and methods have been developed which allow contactless functional tests, for example with electron or ion beams. Accordingly electron beam measuring devices and methods for fault analysis of integrated circuits are known.

In the known devices the substrate to be examined is scanned by deflection of a particle beam. However, due to the deflection of the particle beam only a few square centimetres of the substrate are covered. The current multichip module substrates can have dimensions exceeding 20×20 cm.

Therefore, in order also to be able to test substrates having a large surface area with the aid of a particle beam, a displaceable table has been provided on which the substrate is retained and which can then be moved into a plane perpendicular to the electron beam. In this way the scannable area of substrates can be enlarged to a sufficient extent. However, the drawback has to be accepted that the displacement of the table requires considerably more time than the scanning of the substrate by deflection of a particle beam. Attempts have therefore been made to enlarge the area to be scanned and evaluated on a substrate by deflection of the particle beam.

However, enlargement of the scan area produces the problem that the particle beam must be concentrated to a sufficiently small diameter even in the case of larger deflection angles. In order to achieve this, elements have been provided for dynamic focusing and correction of astigmatism.

During the scanning of larger areas of a substrate by deflection of the electron beam the difficulty also arises of guiding the secondary particles emitted at a specific location to the detector. In EP-B-0 370 276 a special detector and collector construction is described in which the detection characteristic is as uniform as possible over the entire scan area.

The object of the invention is to provide a method and apparatus for improving the testing of substrates having a large surface area.

SUMMARY OF THE INVENTION

With ever-increasing deflection angles the detector signal also changes in so far as the location of the secondary particles emitted on the substrate relative to the position of the detector has an increasing influence on the number of secondary particles reaching the detector. In other words, the detector signal varies to a large extent with the location of the emitted secondary particles relative to the position of the detector.

In order to achieve a uniform signal evaluation over the entire area, therefore, the location of the secondary particles emitted on the substrate relative to the position of the detector is taken into account during testing. In this case there are in principle two variants:

1. Means are provided which guide the secondary electrons from a location or site on the substrate to the detector and are controlled in such a way that a detector signal which is independent of the location is set at the detector.
2. The location or site of the emitted secondary electrons is not taken into account until the evaluation, i.e. in a comparison with the desired reference signal, in which case either the detector signals are compared with location-dependent desired signals or the detector signals are corrected as a function of the location and then compared with a desired signal.

THE DRAWING

The single drawing FIGURE is a schematic diagram of apparatus for performing the testing method according to the invention.

THE PREFERRED EMBODIMENT

The apparatus shown in the drawing consists essentially of a particle beam source 1, particularly an electron beam source for producing a particle beam which traverses a path designated by the arrow 2, an optical system 3 for focusing the particle beam, a deflecting arrangement 4 and a detector 5.

In order to produce a pulsed particle beam the particle beam source 1 has a beam blanking arrangement 1a. In order to correct the particle beam, particularly in the case of larger deflections, means 6 are provided for correction of the focusing and means 7 are provided for correction of the astigmatism.

The particle beam is directed onto a selected site of a substrate 8 to be examined, secondary particles being emitted along a second path shown by the arrow 9, at least some of the emitted secondary particles being detected by the detector 5. In the detector 5 the detected secondary particles are converted into an electrical detector signal 10 which is supplied to an arrangement 11 for evaluation of the detector signal where the detector signal 10 is compared with a desired or reference signal.

In order to improve the testing process it is provided according to the invention that the location or site of the secondary particles emitted on the substrate 8 relative to the position of the detector 5 is taken into account during testing. In this case two variants are conceivable in principle which can be used separately or can also be advantageously combined with one another.

The first variant consists of providing means 12 for guiding the secondary particles from the substrate 8 to the detector 5, these means being controlled by way of a control arrangement 13 as a function of the location of the emitted secondary particles relative to the position of the detector.

The underlying idea of this method is that in the case of two different locations $x_1$ and $x_2$ on the substrate 8 different detector signals are produced if the other conditions, i.e. in particular the number of emitted secondary particles, are identical. This is based on the fact that the emitted particles are emitted in different directions on the substrate 8 and it is therefore necessary to guide the secondary electrons to the detector. For this extraction electrodes are provided which lead to satisfactory results for small scan areas of a few square centimetres. With large deflections, however, markedly different detector signals can occur, although the object examined on the substrate functions in a completely identifiable manner and only its position on the substrate leads to a reduced value detector signal which possibly no longer reaches the necessary desired value.

The means 12 for guiding the emitted secondary electrons consists for example of a plurality of plate-shaped deflecting electrodes which depending upon the location of the emitted secondary electrons are charged with different voltages.

Therefore by corresponding calibration for each scanning point of the particle beam an appertaining voltage can be applied to the means 12 for guiding the secondary particles, so that a uniform detector signal can be obtained over the entire scan area.

The apparatus illustrated in the drawing therefore has a control arrangement 13 which is connected to the deflecting arrangement 4 and the means 12 for guiding the secondary particles. In this way a synchronised control of the means 12 for guiding the secondary particles is ensured as a function of the location or site to which the particle beam is directed.

The necessary control signals for the means 12 for guiding the secondary particles are for example stored for each location of the substrate and are preferably determined empirically in a calibration operation for different points of the scanning field. Alternatively the control signals can also be calculated immediately before the signal detection by way of a location-dependent function.

The second variant according to the invention is based upon the fact that the dependence of the detector signal upon the location of the emitted secondary particles is not taken into consideration until the evaluation of the detector signal. Thus it would be conceivable that the detector signals determined in each case are compared with respective location-dependent desired or reference signals. As an alternative to this, the location-dependent detector signal could first of all be corrected to a location-independent detector signal in order then to be compared with a desired or reference signal.

In order for the particular information regarding the appertaining location of the emitted secondary particles to be available to the arrangement 11 for evaluation of the detector signals 10, this arrangement 11 is connected to the control arrangement 13 which controls the deflecting arrangement 4.

In a preferred embodiment both variants described above, namely the location-dependent control of the means for guiding the secondary particles and the location-dependent evaluation, are taken into consideration.

A special design of the scanning over a large surface area is produced when the scan area of the particle beam is chosen to be so large that an entire unit of the substrate can be tested by beam deflection. Such a unit is constituted for example by a display matrix which is located together with further matrices on a glass plate. Such a unit is also constituted by a printed circuit board which was produced before being singled out as needed from a number of printed circuit boards.

As the size of the substrate to be tested increases, scanning solely by beam deflection, even with the above-mentioned corrections and provisions for the secondary electron detection, can no longer be carried out. However, a combination of beam deflection with a mechanical displacement of the substrate then allows a test. The substrate 8 is retained for this purpose on a support table 14 which is displaceable at least in a plane perpendicular to the particle beam. The properties of the secondary particle detection can be optimised if the deflection of the particle beam takes place preferably in one direction, whilst the substrate is displaced mechanically in the direction perpendicular thereto.

Since the functions or data according to which the guiding of the secondary electrons and the signal comparison are carried out can also be influenced by the testpiece, provision is also made for the storage of the data or functions with the particular type of testing to which it belongs. In the implementation of this feature, in each case before the start of testing the detection parameters belonging to a testpiece are set automatically based upon the identification of the testpiece type. In addition, further operating parameters can be stored, e.g. accelerating voltage, beam current, lens currents, beam pulse duration etc.

The control signals for the deflecting arrangement 4 and the correcting elements 6, 7 which are necessary for positioning the beam can be produced for example by re-calculation of the test point co-ordinates into corrected control signals immediately before the positioning of the beam. In this case system-specific corrections are applied which for example take into consideration the system distortion. The test point co-ordinates can be calculated from testpiece data immediately before the positioning of the beam. Thus for example the database of a TFT matrix which is to be tested consists of the data: original co-ordinates, periodicity (pitch) and number of lines or columns. During the testing the corresponding image point co-ordinates are calculated from these data in each case immediately before the positioning of the beam.

As an alternative to this, the test point co-ordinates can also be read out of a data file. This design is used for example during testing of a printed circuit board, because the contact points to be addressed are not arranged in a regular sequence. If the test points are arranged regularly the sequence of addressed points can be calculated so that the deflection angle between adjacent test points is minimal. In the case of a test of a TFT matrix, this method of operation consists for example of scanning the image points in each case column by column or line by line in meander form, i.e. scanning adjacent columns or lines in the opposite direction in each case.

Because according to the invention the location of the emitted secondary particles relative to the position of the detector is taken into consideration, substrates up to a diameter of 30 cm and more can be tested.

What is claimed is:

1. A method of testing a substrate comprising:
   directing a particle beam onto said substrate in such manner as to cause secondary particles to be emitted from any selected one of a plurality of sites on said substrate, wherein the directing a particle beam includes deflecting said particle beam from one selected site to another;
   guiding at least some of the secondary particles from said one selected site to a signal detector spaced from said one selected site;
   generating signals in response to the detection of the detected secondary particles, said generated signals having values which vary in response to changes in the space between said detector and different ones of said selected sites; and
   comparing the respective signals produced in response to the detection of said detected secondary particles from each of said selected sites with a selected predetermined reference signal.

2. The method according to claim 1 including relatively moving said substrate and said particle beam from one selected site to another.

3. The method according to claim 2 including moving said substrate relative to said particle beam.

4. The method according to claim 1 including relatively moving said substrate and said detector to vary the space between said selected site and said detector.

5. The method according to claim 1 including deflecting said particle beam relative to said substrate to change from one selected site to another and thereby vary the space between said detector and said another selected site.

6. The method according to claim 1 including guiding said at least some of said emitted secondary particles directly from said one selected site to said detector.

7. The method according to claim 6 including controlling the guiding of secondary particles to said detector as a function of the space between said detector and the site of the emitted secondary particles.

8. The method according to claim 6 including controlling the guiding of the secondary particles to said detector as a function independent of the space between said detector and the site of the emitted secondary particles.

9. The method according to claim 2 including moving said substrate simultaneously and in synchronization with the deflection of said particle beam.

10. The method according to claim 1 including determining the selected predetermined reference signal by calibration of said detector.

11. Apparatus for testing a substrate comprising:
    means for producing a particle beam;
    means for directing said beam along a first path to a selected one of a plurality of sites on said substrate whereby secondary particles are produced and emitted along a second path by said substrate at said selected one of said sites;
    means for deflecting said particle beam from said one of said selected sites to another of said selected sites;
    secondary particle detecting means spaced from said selected one of said sites;
    means for guiding secondary particles from said selected one of said sites to said detector means, said detector means being operable to generate a signal having a value which varies in response to differences in the space between said detector and said selected one of said sites; and
    means for comparing the respective signals produced in response to the detection of said detected secondary particles from each of said selected sites with a selected predetermined reference signal.

12. The apparatus according to claim 11 wherein said guiding means comprises deflecting electrodes.

13. The apparatus according to claim 11 wherein said substrate is supported on a movable support, and including means for conjointly moving said support and the substrate supported thereby.

14. The apparatus according to claim 13 including means for deflecting said particle beam simultaneously with the conjoint movement of said support and said substrate.

15. A method of testing a substrate, in which a particle beam is directed onto the substrate and emitted secondary particles are detected with a detector and then evaluated, characterized in that the location ($x_1$, $x_2$) of the secondary particles emitted on the substrate relative to the position of the detector is taken into account during testing, whereby means are provided for guiding the secondary particles from the substrate to the detector, these means being formed of a plurality of plate-shaped deflection electrodes, and these means being controlled as a function of the location ($x_1$, $x_2$) of the emitted secondary particles relative to the position of the detector, and whereby the means for guiding the secondary particle are located below the detector.

16. The method according to claim 15, characterized in that the means which guide the secondary particles are controlled in such a way that a detector signal which is independent of the location ($x_1$, $x_2$) is set at the detector.

17. The method according to claim 15, characterized that the particle beam is deflected for scanning of the substrate.

18. The method according to claim 15, characterized in that the detector produces a detector signal which is based on the secondary particles emitted at a specific location ($x_1$, $x_2$) on the substrate and the detector signal is compared with a desired signal, the location ($x_1$, $x_2$) of the emitted secondary particles relative to the position of the detector being taken into consideration during the comparison.

19. The method according to claim 15, characterized in that the particle beam is deflected in order to scan the substrate and the substrate furthermore is retained on a movable table, the deflection taking place simultaneously and synchronized with the displacement of the table.

20. The method according to claim 15, characterized in that a calibration is carried out in which the values for the control of the means for guiding the secondary particles are determined and stored.

21. The method according to claim 15, characterized in that the values for the control of the means for guiding the secondary particles are calculated immediately before the detection by means of a location-dependent function.

22. A method of testing a substrate, in which a particle beam is directed onto the substrate and emitted secondary particles are detected with a detector and then evaluated, characterized in that the location ($x_1$, $x_2$) of the secondary particles emitted on the substrate relative to the position of the detector is used to produce a detector signal which is compared with a desired signal for the location during testing and evaluation.

23. The method according to claim 22, characterized in that the particle beam is deflected in order to scan the substrate and the substrate furthermore is retained on a movable table, the deflection taking place simultaneously and synchronized with the displacement of the table.

24. An apparatus for testing a substrate, comprising:

means for producing a particle beam;

a detector for detecting secondary particles emitted on the substrate by the particle beam and for producing a detector signal;

means for guiding the secondary particles to the detector; and an arrangement for evaluation of the detector signal;

characterized in that the means for guiding secondary particles emitted on the substrate to the detector are formed of a plurality of plate-shaped electrodes;

a control arrangement is provided which controls the means for guiding the secondary particles as a function of the location of the emitted secondary particles in such a way that a detector signal is produced which is independent of the location; and the means for guiding secondary particles emitted on the substrate to the detector are located below the detector.

25. The apparatus according to claim 24, characterized in that the means for guiding the secondary particles are formed by deflecting electrode.

26. The apparatus according to claim 24, characterized in that a movable table is provided for retaining the substrate.

27. An apparatus for testing a substrate, comprising:

means for producing a particle beam;

means for deflecting the particle beam on a specific location of the substrate;

a detector for detecting secondary particles emitted on the substrate by the particle beam; and an arrangement for evaluation of the detector signal;

characterized in that a control arrangement is provided which is connected to the means for deflection of the particle beam and the means for evaluation of the detector signal can be controlled in such a way that the location of the emitted secondary particles relative to the position of the detector is taken into consideration during the evaluation of the detector signal.

28. An apparatus according to claim 27, characterized in that a movable table is provided for retaining the substrate.

* * * * *